US012712334B2

(12) United States Patent
Richard et al.

(10) Patent No.: US 12,712,334 B2
(45) Date of Patent: Aug. 18, 2026

(54) METHOD AND SYSTEM FOR USING AND COOLING A PORTABLE HIGH-POWERED LASER

(71) Applicant: ACME SOLUTIONS LLC, Albuquerque, NM (US)

(72) Inventors: Robert E. Richard, Albuquerque, NM (US); Jonathan D. Kemp, Jamaica Plain, MA (US); Emil V. Ardelean, Albuquerque, NM (US)

(73) Assignee: ACME SOLUTIONS LLC, Albuquerque, NM (US)

( * ) Notice: Subject to any disclaimer, the term of this patent is extended or adjusted under 35 U.S.C. 154(b) by 863 days.

(21) Appl. No.: 17/651,286

(22) Filed: Feb. 16, 2022

(65) Prior Publication Data

US 2023/0261433 A1 Aug. 17, 2023

(51) Int. Cl.
*H01S 5/024* (2006.01)
*H01S 5/023* (2021.01)

(52) U.S. Cl.
CPC .......... *H01S 5/02423* (2013.01); *H01S 5/023* (2021.01)

(58) Field of Classification Search
CPC .................................................. H01S 5/02423
See application file for complete search history.

(56) References Cited

U.S. PATENT DOCUMENTS 4,276,520 A 6/1981 Rosenberg
5,617,444 A 4/1997 Houde-Walter
5,761,235 A 6/1998 Houde-Walter
5,837,918 A 11/1998 Sepp
8,203,109 B2 6/2012 Taylor et al.
8,752,465 B2 6/2014 Houde-Walter
9,250,044 B1 2/2016 Raring et al.
10,900,755 B1 1/2021 Paranto et al.
2006/0214177 A1 9/2006 Jones
2007/0132470 A1* 6/2007 Kamakura .......... H01S 5/02415 324/750.08
2007/0291803 A1* 12/2007 Crum .................. H01S 5/02407 372/34

(Continued)

FOREIGN PATENT DOCUMENTS

CN 106532428 A 3/2017
DE 10252685 A1 6/2004

(Continued)

OTHER PUBLICATIONS

Jia-Xin Li et al., Experimental investigation of spray-sublimation cooling system with CO2 dry-ice particles, Applied Thermal Engineering, vol. 174, 2020, 115285, ISSN 1359-4311 https://doi.org/10.1016/j.applthermaleng.2020.115285 (Year: 2020).*

(Continued)

*Primary Examiner* — Minsun O Harvey
*Assistant Examiner* — Stephen Sutton Kotter
(74) *Attorney, Agent, or Firm* — Baker Botts L.L.P.

(57) ABSTRACT

A system includes one or more diodes, a power source, a tank, and a cooling plate. The power source is coupled to the one or more diodes and the tank is operable to store a fluid under pressure. The cooling plate includes one or more channels configured to receive at least some of the fluid stored in the tank and is operable to transfer heat from the one or more diodes to the fluid through the one or more channels.

22 Claims, 4 Drawing Sheets

(56) References Cited

U.S. PATENT DOCUMENTS

| | | | | |
|---|---|---|---|---|
| 2011/0024403 | A1 | 2/2011 | Bradley et al. | |
| 2013/0016215 | A1 | 1/2013 | Bitar et al. | |
| 2015/0369570 | A1 | 12/2015 | Conemac | |
| 2018/0083418 | A1* | 3/2018 | Kanskar | H01S 5/042 |
| 2018/0163477 | A1* | 6/2018 | Faircloth | H01S 5/042 |
| 2020/0280167 | A1* | 9/2020 | Holland | H01S 5/42 |
| 2021/0131768 | A1 | 5/2021 | Paranto et al. | |
| 2021/0381736 | A1* | 12/2021 | Rockenfeller | F28D 15/00 |

FOREIGN PATENT DOCUMENTS

| | | | |
|---|---|---|---|
| DE | 10313412 | A1 | 10/2004 |
| DE | 10333256 | A1 | 3/2005 |
| DE | 102017104662 | A1 | 9/2018 |
| ES | 2657973 | T3 | 3/2018 |
| WO | WO2006103655 | A2 | 10/2006 |

OTHER PUBLICATIONS

PCT Notification of Transmittal of the International Search Report and the Written Opinion of the International Searching authority, or the Declaration with attached International Search Report and Written Opinion of the International Searching Authority in International Application No. PCT/US2023/062521 dated Jun. 7, 2023 .

* cited by examiner

METHOD AND SYSTEM FOR USING AND COOLING A PORTABLE HIGH-POWERED LASER

TECHNICAL FIELD

This disclosure relates in general to portable lasers and cooling systems, and more particularly to a method and system for using and cooling a portable high-powered laser.

BACKGROUND

High-power infrared lasers are known in the art for applications including welding, cutting, and fabrication for manufacturing, as well as military applications including strategic weapons, sensor disabling/dazzling (including human), and the disposal of unexploded ordinance. However, while today's lasers are much more efficient and reliable than their predecessors, no self-contained, human-portable lasers exist for these high-power applications. Typically, if a portable high-power application is desired, the power, optics, and cooling systems needed to support these lasers require mounting on a mobile platform or turret, typically on a land, air, or water vehicle. These systems weigh hundreds or thousands of pounds and require significant energy input in support. The human-portable laser systems available today lack the power to act as either incendiary weapon or welding system, and are typically only used for sensor denial, dazzling of human targets, or as laser pointers.

SUMMARY OF THE DISCLOSURE

According to one embodiment, a system for emitting a high-powered laser is provided. The system includes one or more diodes, a power source, a tank, and a cooling plate. The power source is coupled to the one or more diodes and the tank is operable to store a fluid under pressure. The cooling plate includes one or more channels configured to receive at least some of the fluid stored in the tank and is operable to transfer heat from the one or more diodes to the fluid through the channels.

According to another embodiment, a method for emitting a high-powered laser is provided. The method includes generating a laser using at least one diode mounted to a cooling plate and releasing a pressurized fluid stored in a tank. The method further comprises directing fluid through a channel of the cooling plate, wherein directing the fluid through the channel causes heat transfer between the at least one diode and the fluid.

According to yet another embodiment, an apparatus for emitting a high-powered laser is provided. The apparatus includes one or more diodes, a power source, a tank, a cooling plate, and a housing. The power source is coupled to the one or more diodes and the tank is operable to store a fluid under pressure. The cooling plate includes a plurality of channels, wherein each channel corresponds to at least one diode and is configured to receive at least some of the fluid stored in the tank and the cooling plate is operable to transfer heat from the one or more diodes to the fluid through the channels. The housing is configured to encase the one or more diodes, the power source, the tank, and the cooling plate.

Technical advantages of certain embodiments may include the portability of a stand-alone, high-power laser system. The system may be aimed and operated while moving or stationary, and the system can function for an operationally significant time without any external connections, such as to power or cooling systems. In some embodiments, the portable high-power laser system may be transported on a wheeled cart, mounted to a vehicle or a static platform, adapted for use in outer space, or used underwater. Further, certain embodiments described herein may use a novel cooling apparatus which stores high-pressure gases used to cool a device. This disclosure also recognizes technical benefits of combining one or more of the high-power laser systems described herein into a single output device or system thereby multiplying the available power output. The cooling apparatus may provide certain technical advantages, such as the absence of significant external noise or heat signature. Other technical advantages will be readily apparent to one skilled in the art from the following figures, descriptions, and claims. Moreover, although specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION OF THE DISCLOSURE

To facilitate a better understanding of the present disclosure, the following examples of certain embodiments are given. The following examples are not to be read to limit or define the scope of the disclosure. Embodiments of the present disclosure and its advantages are best understood by referring to FIGS. 1 through 4B, where like numbers are used to indicate like and corresponding parts.

Conventional laser systems require heavy power and cooling systems and are unable to focus the output of power with a high level of precision at long distances. These conventional laser systems present a significant burden by way of transportation and operation. For example, a 400 lb gas generator and 400 lb water cooler are required to properly power and cool some existing laser systems. The laser of such systems, therefore, is unable to be self-contained and requires the support of additional, heavy and expensive components. All told, existing systems can weigh as much as 1500 lbs. And such systems are not rechargeable and thus have limited use in remote locations. In addition to the extra weight and expense, conventional laser systems also lack the ability to focus high power at long distances, reducing their utility for certain applications.

The teachings of the present disclosure recognize that these above problems can be addressed by providing a self-contained, portable, high-powered laser. Rather than rely on a separate and unduly heavy power supply, the present system may be powered by rechargeable lithium-ion batteries. The system may further contain a novel cooling apparatus that provides no significant external noise nor heat signature. Cooling may be provided by thermochemistry, rather than battery power, and cooling means may be stored as a compressed gas such as carbon dioxide ($CO_2$). Both the power and cooling systems may be readily reusable and rechargeable. The system described herein may be capable of cutting or melting metal at distances greater than 100 meters, while outputting a laser beam that is both invisible and silent. Potential applications include tactical military weapons, welding, construction, and manufacturing. The following describes systems and methods for using and cooling a portable high-powered laser for providing these and other desired features.

Figure 1:
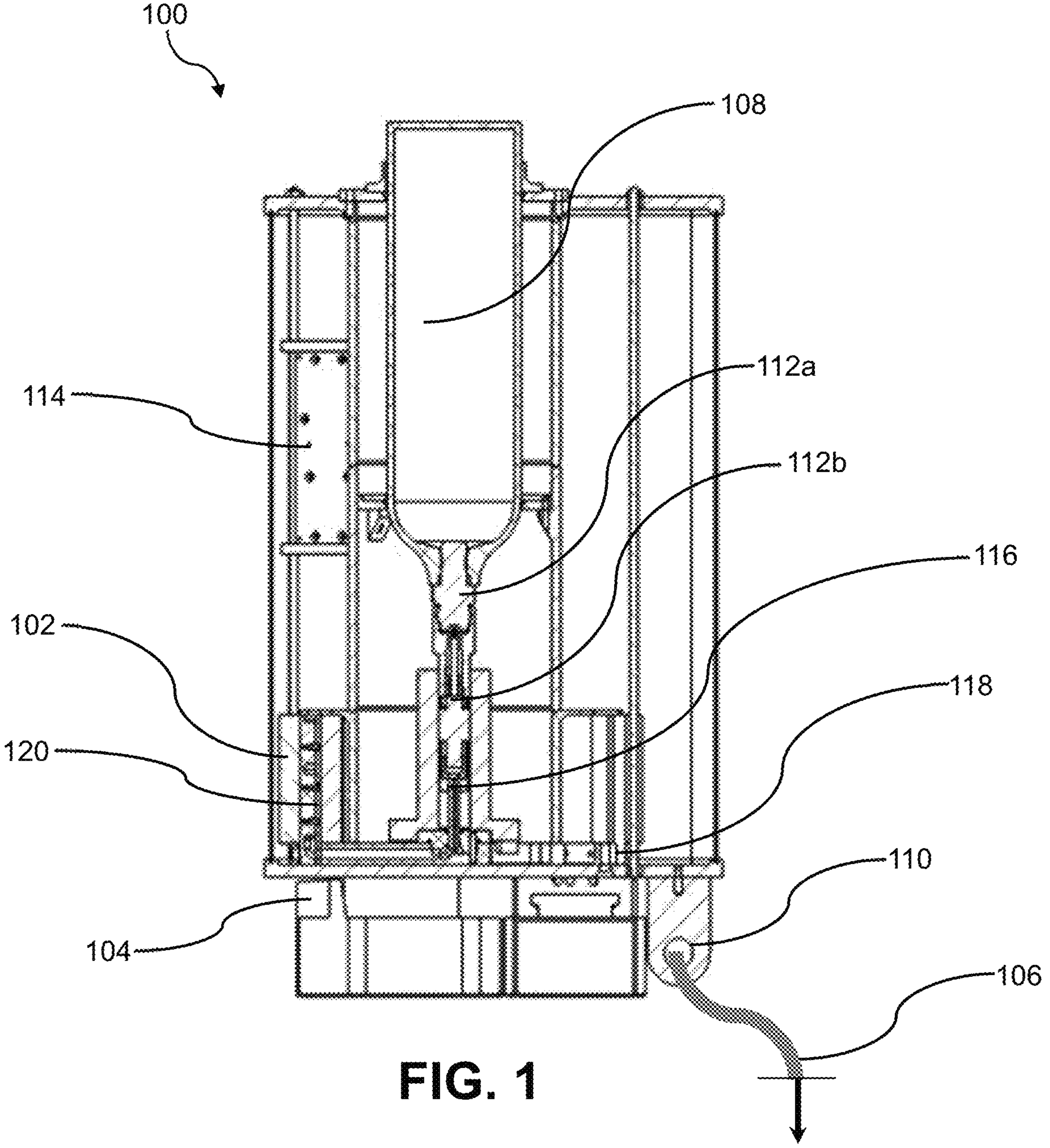
FIG. 1 illustrates a cross-section view of a high-power laser system including a cooling apparatus, according to certain embodiments.

FIG. 1 illustrates a perspective view of a high-power laser system 100, according to certain embodiments. High power laser system 100 includes at least one diode 102, a power source 104, and a cooling apparatus, but may optionally include one or more other components as well. In some embodiments, system 100 may be self-contained. As used herein, this disclosure uses the term "self-contained" to mean that all components of system 100 are contained within a single unit or apparatus, and does not require external components such auxiliary power or cooling equipment. As will be described below in reference to FIG. 3, system 100 may be contained within a housing.

As depicted in FIG. 1, system 100 is configured to generate a laser using the at least one diode 102, which is powered by power source 104 and cooled using a cooling apparatus. In some embodiments, such as that shown in FIG. 1, system 100 is portable and self-contained, (i.e., power source and cooling apparatus are located internal to system 100). The portability and self-contained aspects of this invention have several advantages, including the ability by a user to carry system 100 in a backpack and carefully aim the laser at target objects. In some embodiments, a laser may be outputted externally through fiber cable 106.

Diode(s) 102 is operable to convert electrical energy into light to create the laser of system 100. System 100 may include one, two, three, or any other suitable number of diodes 102. Because laser diodes create significant heat, this heat must be removed to protect the diodes from failure or from causing thermal failures of other parts of the system. As will be described in further detail below, this disclosure recognizes providing a source of cooling for diodes 102 by performing a heat exchange facilitated by the controlled release of compressed fluid from a tank (e.g., tank 108). Diode(s) 102 may be any type of diode suitable for use as a fiber laser, including a light-emitting diode. In some embodiments, diode(s) 102 may heat up and produce a laser beam that is amplified inside system 100 and is then directed outside system 100 via a flexible fiber cable 106 extending from a fiber cable portal 110. In some embodiments, flexible fiber cable 106 includes an inner glass fiber which carries the laser beam. In particular embodiments, flexible fiber cable 106 is a single glass fiber less than 100 microns in diameter.

Power source 104 is configured to provide power to diode(s) 102. Power source 104 may be any technology capable of operating as a source of power. In certain embodiments, power source 104 includes one or more batteries. In a particular embodiment, power source 104 includes one or more rechargeable lithium batteries. As will be recognized by one of ordinary skill in the art, power source 104 may be located in any suitable position. Accordingly, power source 104 may be located on, in, or through system 100 and be accessible, for example, from the exterior of system 100 via a battery cover. In certain embodiments, any number of batteries may be mounted to the interior or exterior of housing 402, which may encase system 100. Such batteries may have an integral attachment and protection structure, or alternatively may resemble portable computer batteries, remote control vehicle batteries, marine batteries, aviation batteries, or automotive batteries. In other embodiments, power may be provided directly or indirectly via other means of generation, including solar, wind, chemical reactions, or by combustion engine. In some embodiments, self-generated power or externally generated power is first stored in power source 104 or similar vessels for later use in system 100. In a particular embodiment, power source 104 may also provide power to control processing hardware 114 or other components.

As described above, system 100 includes a cooling apparatus. As will be explained in further detail below with respect to FIG. 2, the cooling apparatus of system 100 may include a tank 108, one or more valves 112, a manifold 116, diffusion device 118, and a cooling plate 120. Generally, the cooling apparatus of system 100 provides the cooling necessary to prevent failures to system 100.

FIG. 1 also shows that system 100 may include additional componentry, such as control processing hardware 114 and a diffusion device 118. In some embodiments, the operation of diode(s) 102 and other structures (e.g., valves 112) are controlled by control processing hardware 114. Control processing hardware 114 is configured to provide requisite power and control signals to diode(s) 102 such that diode(s) 102 produce and amplify a laser beam, as discussed above. Control processing hardware 114 may provide requisite power and control signals to components of system 100 manually or automatically. For example, control processing hardware 114 may provide requisite power and control signals to components of system 100 in response to receiving an input by an operator. Alternatively, control processing hardware 114 may be configured to perform in an automated mode such that it provides requisite power and control signals to components of system according to an executable algorithm.

Control processing hardware 114 may also control the operation of valves **112*a* and 112*b*. In certain embodiments, control processing hardware 114 may open valves 112*a* and 112*b* in response to activating (or otherwise sending a control signal to) diode(s) 102. In other embodiments, control processing hardware 114 may open valves 112*a* and 112*b* in response to a temperature determination. In such an embodiment, system 100 may also include one or more sensors communicatively coupled to control processing hardware 114 and configured to detect temperature. Such sensors may relay temperature information to control processing hardware 114 for use by control processing hardware 114. As an example, in response to receiving temperature information from a sensor, control processing hardware 114 may compare the received temperature information to a temperature threshold stored in control processing hardware 114 and, based on the comparison, determine to send a control signal to one or more of valves 112 to open. This disclosure recognizes that the temperature threshold may, in some embodiments, be the ambient temperature. As such, this disclosure also recognizes that control processing hardware 114 may further be configured to determine temperature differences between external and internal surfaces of system 100 such as, e.g., by positioning one or more sensors on both the external and internal surfaces of system 100. In some embodiments, the temperature information sensed by the one or more sensors may include temperature information related to one or more diode(s) 102**. Opening valves 112*a* and 112*b* marks the start of the process that results in the cooling of diode(s) 102. In a particular embodiment, all electronic control may be provided from within system 100. In alternative embodiments, electronic control may be provided remotely, for example via a handheld device such as a phone, tablet, or custom interface device, by cloud or network at a distant location, or by any combination thereof.

Figure 2:
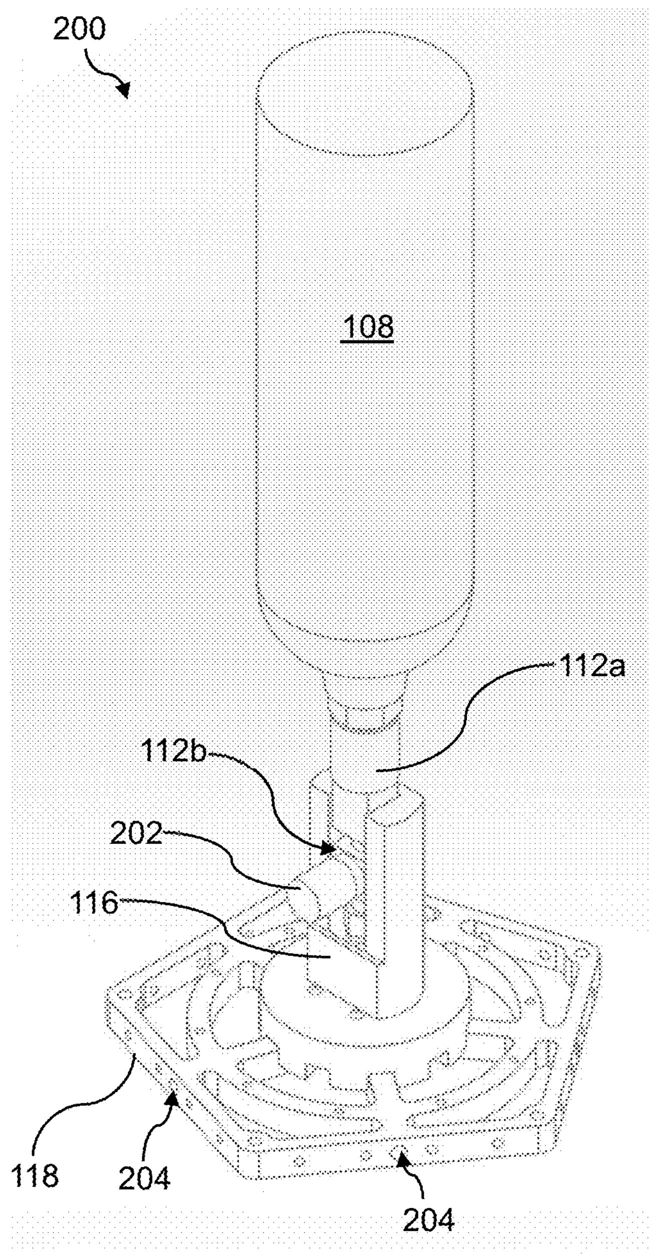
FIG. 2 illustrates the cooling apparatus of FIG. 1, according to certain embodiments.

FIG. 2 illustrates a perspective view of a cooling apparatus 200, such as the one described above with regards to FIG. 1. As shown in FIG. 2, cooling apparatus 200 may include one or more of tank 108, primary valve 112*a*, secondary valve 112*b*, manifold 116, and diffusion device 118. As discussed above, cooling apparatus 200 may provide cooling to system 100 to prevent failures, such as those caused by thermal heating due to inclusion of diode(s) 102.

Tank 108 is operable to store a fluid under pressure. The term fluid is understood herein to encompass a gas, a liquid, or a combination of gas and liquid. In a particular embodiment, the fluid is carbon dioxide ($CO_2$) gas, which has several beneficial properties for certain applications. For example, $CO_2$ is non-toxic, compressible, renewable, and becomes extremely cold when released from a pressurized tank. At high pressure, $CO_2$ can be stored as a liquid, or with elevated temperatures, as a material above its triple phase point. Any other gas or liquid may be used, however, those with properties similar to that of $CO_2$ may be preferred. This disclosure specifically recognizes that one or more of the following fluids may be used in the cooling apparatus described herein: Dichloro difluro-methane Freon-12 (R-12); Tetra fluro-ethane or R-134a or HFC-134a; R-22; R-410A; and R-32. This listing, however, is exemplary. Furthermore, this disclosure recognizes that system 100, generally, including apparatus 200, may be either open (i.e., fluid is released after decompression/heating) or closed (i.e., fluid is captured and recompressed for re-use after decompression/heating), and that the open or closed nature of such system may depend on the application (e.g., closed system may be particularly beneficial for space applications).

As stated above, tank 108 is operable to store a pressurized fluid. Tank 108 may be rated to store any desired psi (e.g., 4500 psi), but is preferably at least 700 psi. Tank 108 may be composed of any material suitable for storing a fluid under pressure, including aluminum, titanium, or other light-weight metal. In some embodiments, tank 108 is composed of a metal alloy, such as steel. This disclosure specifically recognizes that certain materials may work better than others for storing a fluid under pressure. In a particular embodiment, tank 108 has an aluminum liner for corrosion resistance, and is jacketed in one or more of glass fiber, carbon fiber and resin.

Although this disclosure specifically describes and illustrates an embodiment using pressurized fluid to perform the cooling function described herein, this disclosure recognizes that cooling may be accomplished via other means such as, for example, using plain compressed air, blown air, or by flowing a liquid (e.g., air, water) through the channels. In such embodiment, system may include a modified cooling apparatus 200 that does not include, for example, tank 108 and/or ancillary componentry facilitating the flow of fluid into diffusion device 118 (e.g., valves 112, valve orifice 202, manifold 116). As noted above, such embodiment might, for example, include one or more fans configured to circulate and/or redistribute air in a manner that provides cooling to the liquid flowing through channels of diffusion device 118 and/or cooling plate 120, or the cooling plate 120 may simply have enough mass to act as a heat sink.

As discussed in reference to FIG. 1, system 100 may include one or more valves 100. As shown in both FIGS. 1 and 2, system 100 and cooling apparatus 200 each include two valves—primary valve 112*a* and secondary valve 112*b*. Although this disclosure describes and depicts system 100 and cooling apparatus 200 each including two valves 112, this disclosure recognizes that any suitable number of valves 112 may be employed to achieve a desired outcome. Valves 112*a* and 112*b* are positioned between tank 108 and manifold 116 and are configured to control the flow of the fluid stored in tank 108.

Valves 112*a* and 112*b* are configured to control the release of fluid stored in tank 108. Valves 112 may be any suitable type of valve configured to control a flow of fluid. In a particular embodiment, primary valve 112*a* is a one-way valve positioned at or near the mouth of tank 108 and controls the release of fluid (e.g., $CO_2$) from tank 108. In another embodiment, the mouth of tank 108 may be coupled to a hose or other structure having a channel for directing the fluid, and primary valve 112*a* may be positioned at or near the end of the hose or channel, or at an intermediate point along such hose or channel.

In some embodiments, the release of fluid from tank 108 is further gated by a secondary valve 112*b*. Secondary valve 112*b* may, for example, be a powered solenoid valve. Secondary valve 112*b* may, in certain embodiments, such as the one shown in FIG. 2, include valve orifice 202, which collectively act as a nozzle configured to induce the flow of fluid stored in tank 108. As discussed above, valves 112 may be controlled in various ways, including but not limited to, manually, remotely by an operator or by a local or remote computer processor, or automatically by the control processing hardware 114.

Opening of valve(s) 112 allows the pressurized fluid previously stored in tank 108 to flow into manifold 116, where it is allowed to expand. This expansion of the pressurized fluid results in a reduction of both pressure and temperature. Where $CO_2$ is employed as the fluid in cooling apparatus 200, the expansion may allow for the creation of atomized dry ice, or "$CO_2$ Snow." In some embodiments, after expanding through manifold 116, the fluid is directed to a diffusion device 118, which distributes the cooled fluid into one or more channels (see, e.g., channel(s) 204 shown in FIG. 2) therein. In certain embodiments, channels (e.g., channel 204 shown in FIG. 2) direct the flow of the cooled fluid to one or more other channels in cooling plate(s) 120 located near diode(s) 102. This disclosure specifically recognizes that channels (e.g., channel 204 shown in FIG. 2) of diffusion device 118 may direct cooled fluid to one or more channels of a cooling plate (e.g., cooling plate 120).

In certain embodiments, diffusion device 118 divides or otherwise distributes the flow of the cooled fluid into one or more channels (not illustrated) of cooling plate 120. In some of those embodiments, each channel is associated with a single cooling plate 120 (not shown in FIG. 2) and a single diode 102 (not shown in FIG. 2). In other embodiments, a channel may be associated with a plurality of cooling plates 120 and/or diodes 122. Diffusion device 118 may be shaped so that the cooled fluid is distributed in a substantially equal fashion among the plurality of channels (e.g., channel 204 shown in FIG. 2). In an alternative embodiment, diffusion device 118 is shaped so that the cooled fluid is distributed in an unequal fashion among the plurality of channels (e.g., channel 204 shown in FIG. 2). This disclosure contemplates that diffusion device 118 may be integral with, or separate from, manifold 116.

Cooling apparatus 200 may also include one or more cooling plates 120. Although not depicted in FIG. 2, an example of a cooling plate 120 is shown in FIG. 1. Generally, cooling plate 120 is configured to secure diode(s) 102 and to facilitate heat transfer between diode(s) 102 and the fluid flowing through cooling apparatus 200. In a particular embodiment, each diode 102 of system 100 is mounted to a different cooling plate 120 of system 100. In an alternative embodiment, more than one diode 102 of system 100 is mounted to a single cooling plate 120. Diode(s) 102 may be mounted directly or indirectly to the cooling plate 120. Additionally, this disclosure contemplates that cooling plate 120 may be integral with, or separate from, one or more of manifold 116 and diffusion device 118.

Each cooling plate 120 of cooling apparatus 200 may be configured to receive fluid under a high pressure and reduce the fluid to a low pressure as the fluid flows through one or more channel(s) therein. The high pressure may be 1000 psi (69 BAR), suitable for maintaining $CO_2$ in liquid state at room temperature. The low pressure may be, for example, 14.5 psi (1 BAR). A majority of the reduction in the pressure of the fluid from the high pressure to the low pressure may occur in a portion of channel(s) (e.g., channel 204 shown in FIG. 2) near diode(s) 102.

Figure 3:
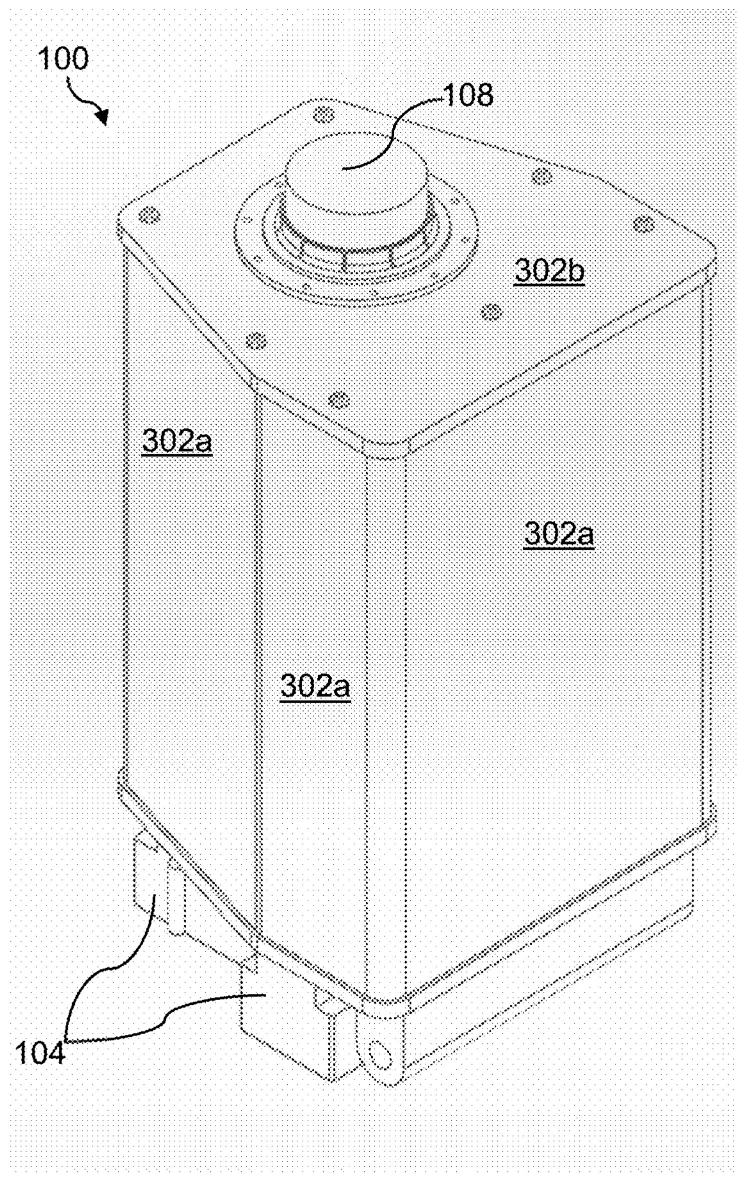
FIG. 3 illustrates a side view of the system of FIG. 1, according to certain embodiments.

FIG. 3 illustrates a perspective view of an exterior of system 100, according to certain embodiments. As shown in FIG. 3, system 100 may further include a housing 402 that encases the componentry discussed above with respect to FIGS. 1 and 2. Housing 402 may comprise any suitable size or shape. In some embodiments, housing 402 includes one or more side walls 302*a* and one or more ends 302*b*. As illustrated in FIG. 1, housing 402 has a hexagonal cross-section, having six side walls 302*a*. Housing 402 in other embodiments may have more or less side walls 302*a* (e.g., four sides or seven sides), and still other embodiments may have no distinguishable sides at all (e.g., rounded housing). Housing 402 may also include one or more rounded or straight side walls 302*a*, or be a combination of both. As illustrated in FIG. 3, ends 302*b* and side wall 302*a* comprising housing 402 are coupled with tie rods and nuts. Although this disclosure describes and depicts a certain manner of coupling ends 302*b* and side walls 302*a*, this disclosure recognizes that ends 302*b* and side walls 302*a* of housing 402 may be coupled in any suitable manner. Furthermore, this disclosure recognizes that housing 402 may be constructed and strengthened with an assortment of different materials, such as carbon fiber, fiberglass, or metal, in addition to any other suitable material, alone or in combination.

As shown in FIG. 3, tank 108 may be configured to fit within a cavity defined by one or more structures of system 100. As an example, tank 108 may fit or otherwise be installed between a retaining structure integral to housing 402. As another example, tank 108 may sit within a cradle positioned along the exterior of a side wall 302*a*. In some embodiments, tank 108 is removable from system 100. Tank 108 may be of any suitable size and shape, and in some embodiments may have a size and shape that, when installed within system 100, extends beyond, or protrudes out from, end 302*b* of housing 402. As one of ordinary skill in the art will recognize, tank 108 may be configured to have a size and shape that enables removal from system 100. As shown in FIG. 1, tank 108 is accessible to a user from the exterior of housing 402. Although this disclosure describes and depicts tank 108 as being removably installed within a housing 402 of system 100, this disclosure also contemplates other embodiments wherein tank 108 is not removable from housing 402 and/or is not installed within housing 402 at all. For example, tank 108 may be located entirely within housing 402 such that it cannot be easily accessed or removed. As another example, tank 108 may be located remote from other components of system 100 and coupled to such components of system 100 by a hose or external plumbing.

As described above with respect to tank 108, power source 104 may also be stored inside of housing 402 and may be accessible for removing and/or changing from the exterior of housing 402. Accordingly, power source 104 may, in some embodiments, be secured in place by a retaining structure integral to housing 402. In other embodiments, however, power source 104 may be coupled to the exterior of a side wall 302*a* or end 302*b*. For example, power source 104 may be configured to sit within a cradle positioned along the exterior of a side wall 302*a*. In some embodiments, power source 104 is removable from system 100. Furthermore, power source 106 may be of any suitable size and shape.

Particular embodiments of system 100 may be lightweight. As used herein, the term "lightweight" is used to refer to a weight less than 100 pounds. Some embodiments of system 100 may be operable to generate 100 Watts or more of power, which may be suitable for multiple applications. For example, in particular embodiments, system 100 is capable of cutting or melting metal at distances greater than 100 meters, generating approximately 1 kilowatt per square centimeter of power at impact with the target. As another example, certain embodiments of system 100 may imitate a plasma or welding torch at a distance of 300 meters from a target. As yet another example, some embodiments of system 100 may be used to ignite incendiary material at distances of 1000 meters or greater from a target—even through certain materials (e.g., glass or lexan). One additional example is that certain embodiments of system 100 may also serve to disable targets by, for example, blinding with an infrared or camera system from a large distance (e.g., 5,000 meters or greater).

Figure 4:
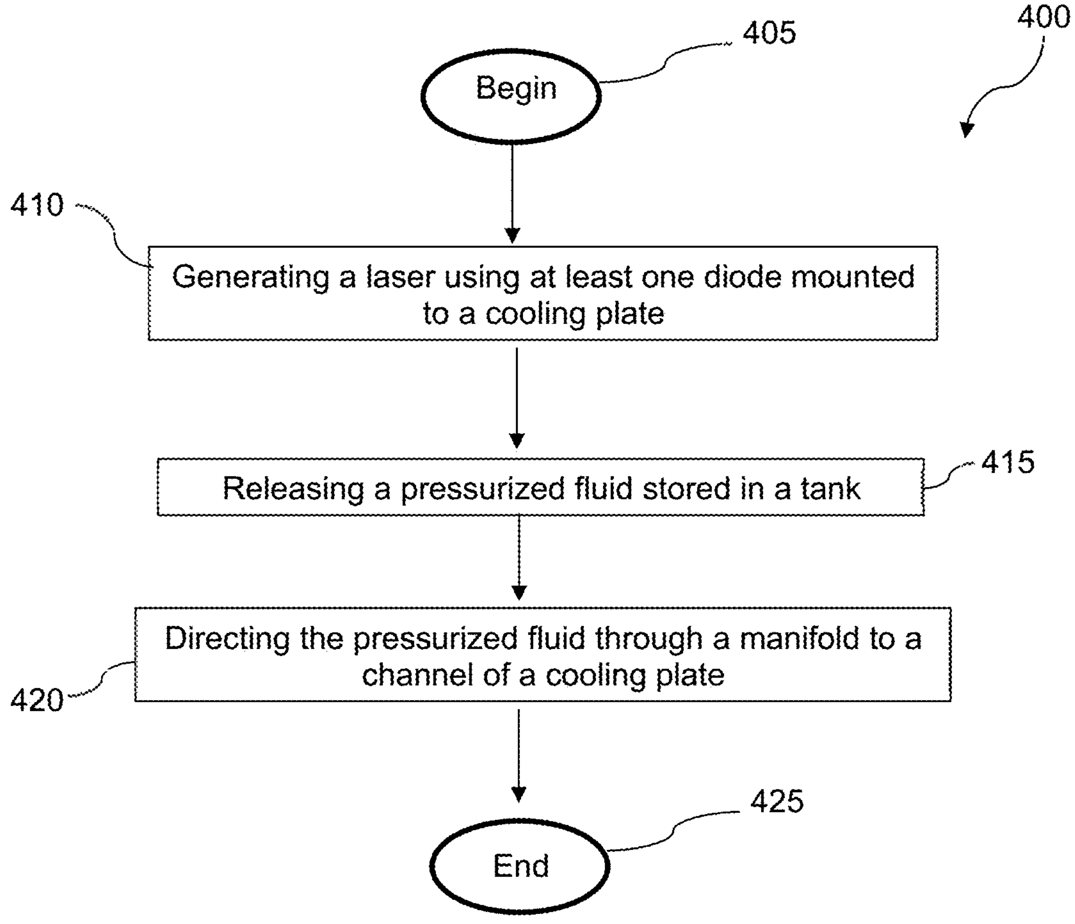
FIG. 4 illustrates a flowchart describing the method steps for using the cooling apparatus of FIG. 2, according to certain embodiments.

FIG. 4 illustrates a flowchart describing a method 400 for emitting a high-powered laser. The method 400 begins at a step 405 and proceeds to a step 410. At step 410, the method includes generating a laser using at least one diode mounted to a cooling plate. As discussed above with reference to FIG. 1, the laser may be generated as a result of the at least one diode receiving a control signal from control processing hardware 114. After generating the laser, the method 400 may proceed to a step 415. At step 415, the method includes releasing a pressurized fluid in a tank. As discussed above with reference to FIG. 1, the fluid may be released from tank by opening one or more valves 112. The opening of the valves may be performed upon receiving a control signal, which in some embodiments, is automatic and occurs in response to determining that a temperature of system 100 has reached or exceeded a threshold. As explained with respect to FIG. 2, the pressurized fluid released from the tank may be a gas and, in particular, may be $CO_2$. After releasing the pressurized fluid from the tank, the method 400 may proceed to a step 420. At step 420, the method includes directing the pressurized fluid through a manifold to a channel of a cooling plate. By directing the pressurized fluid to the channel of the cooling plate, the method causes heat transfer to occur between the cooling plate and the fluid.

A number of implementations have been described. Nevertheless, it will be understood that various modifications may be made without departing from the spirit and scope of the invention. For example, this disclosure recognizes that a portable high-powered laser can also be cooled passively rather than active cooling by way of, for example, cooling apparatus 200. In such an embodiment, system 100 would not require tank 108 and/or ancillary componentry facilitating the flow of fluid into diffusion device 118 (e.g., valves 112, valve orifice 202, manifold 116). In such embodiment, passive cooling may be facilitated by components within or surrounding diodes 102 (e.g., metal in diode(s) 102; mounting structures for diode(s)) absorbing and releasing excess heat. Such an embodiment may be suitable for applications where the portable high-powered laser is only activated for short durations of time.

Elements of different implementations described herein may be combined to form other implementations not specifically set forth above. Elements may be left out of the processes, structures, and systems described herein without adversely affecting their operation. Furthermore, various separate elements may be combined into one or more individual elements to perform the functions described herein. Although certain example embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A system for emitting a high-powered laser, the system comprising:
- one or more light-emitting diodes;
- a power source coupled to the one or more diodes, the power source comprising one or more batteries;
- a tank operable to store carbon dioxide at a pressure above 700 pounds per square inch;
- an assembly comprising a valve and a nozzle operable to control a flow of the carbon dioxide from the tank;
- a cooling plate including a plurality of channels, wherein:
  - each channel corresponds to at least one diode and is operable to receive at least some of the carbon dioxide stored in the tank;
  - the cooling plate is operable to transfer heat from the diode to the carbon dioxide through the channels; and
- a housing configured to encase the one or more diodes, the power source, the tank, and the cooling plate;
- wherein:
  - the carbon dioxide is introduced to the assembly as a liquid and is discharged from the assembly to the cooling plate as a solid particulate stream;
  - the high-powered laser is operable to generate at least 100 Watts of output power; and
  - the system has a weight of less than 45 pounds per 1000 Watts of output power.

2. A system for emitting a high-powered laser, the system comprising:
- one or more diodes;
- a power source coupled to the one or more diodes;
- a tank operable to store a fluid under pressure;
- a valve operable to control a flow of the fluid from the tank through a nozzle configured to facilitate a phase change of the fluid from a liquid to a particulate; and
- a cooling plate comprising one or more channels configured to receive at least some of the particulate, the cooling plate being operable to transfer heat from the one or more diodes to the particulate through the one or more channels; and
- wherein the system has a weight of less than 45 pounds per 1000 Watts of output power.

3. The system of claim 2, wherein the one or more diodes are light-emitting diodes.

4. The system of claim 2, wherein the power source comprises one or more batteries.

5. The system of claim 2, further comprising a manifold downstream the nozzle and operable to discharge the particulate to the cooling plate.

6. The system of claim 2, wherein the fluid is one of:
- carbon dioxide;
- Dichloro difluro-methane Freon-12 (R-12);
- Tetra fluro-ethane (R-134a or HFC-134a);
- Chlorodifluoromethane (R-22);
- R-410A; and
- R-32.

7. The system of claim 2, wherein the tank is operable to store the fluid at a pressure above 700 pounds per square inch.

8. The system of claim 2, further comprising a control processing hardware operable to open the valve in response to determining:
- that the one or more diodes have been activated; or
- a temperature associated with the one or more diodes meets or exceeds a temperature threshold.

9. The system of claim 2, wherein the weight of the system is less than 100 pounds.

10. A method for emitting a high-powered laser, the method comprising:
- generating a laser using at least one diode mounted to a cooling plate;
- releasing a pressurized fluid stored in a tank via a valve operable to control a flow of the fluid from the tank through a nozzle configured to facilitate a phase change of the fluid from a liquid to a particulate;
- directing the particulate through a manifold to a channel of the cooling plate, wherein directing the particulate causes heat transfer between the at least one diode and the particulate; and
- wherein a system comprising the at least one diode, the cooling plate, the tank, the valve, and the manifold has a weight of less than 45 pounds per 1000 Watts of output power.

11. The method of claim 10, wherein the system further comprises a power source.

12. The method of claim 10, further comprising a manifold downstream the nozzle and operable to discharge the particulate to the cooling plate.

13. The method of claim 10, wherein the pressurized fluid is one of:
- carbon dioxide;
- Dichloro difluro-methane Freon-12 (R-12);
- Tetra fluro-ethane (R-134a or HFC-134a);
- Chlorodifluoromethane (R-22);
- R-410A; and
- R-32.

14. The method of claim 10, wherein the pressurized fluid is pressurized to at least 700 pounds per square inch.

15. The method of claim 10, further comprising a control processing hardware operable to open the valve in response to determining:
- that one or more diodes have been activated; or
- a temperature associated with the one or more diodes meets or exceeds a temperature threshold.

16. A system for emitting a high-powered laser, the system comprising:
- one or more diodes;

a power source coupled to the one or more diodes;

a tank operable to store a fluid under pressure;

a valve operable to control a flow of the fluid from the tank through a nozzle configured to facilitate a phase change of the fluid from a liquid to a particulate;

a cooling plate including at least one channel, wherein:

the at least one channel corresponds to at least one diode and is operable to receive at least some of the particulate;

the cooling plate is operable to transfer heat from the diode to the particulate through the at least one channel;

a housing configured to encase the one or more diodes, the power source, the tank, the valve and the cooling plate; and wherein the system has a weight of less than 45 pounds per 1000 Watts of output power.

17. The system of claim 16, wherein the power source comprises one or more batteries.

18. The system of claim 16, further comprising a manifold downstream the nozzle and operable to discharge the particulate to the cooling plate.

19. The system of claim 16, wherein the fluid is one of:

carbon dioxide;

Dichloro difluro-methane Freon-12 (R-12);

Tetra fluro-ethane (R-134a or HFC-134a);

Chlorodifluoromethane (R-22);

R-410A; and

R-32.

20. The system of claim 16, further comprising a control processing hardware operable to open the valve in response to determining:

that the one or more diodes have been activated;

or a temperature associated with the one or more diodes meets or exceeds a temperature threshold.

21. The system of claim 16, wherein the housing is portable.

22. The system of claim 16, wherein the weight of the system is less than 100 pounds.

* * * * *